United States Patent
Sandhu et al.

(10) Patent No.: US 8,026,132 B2
(45) Date of Patent: Sep. 27, 2011

(54) LEAKAGE BARRIER FOR GAN BASED HEMT ACTIVE DEVICE

(75) Inventors: Rajinder Randy Sandhu, Castaic, CA (US); Michael Edward Barsky, Sherman Oaks, CA (US); Michael Wojtowicz, Long Beach, CA (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 242 days.

(21) Appl. No.: 12/026,099

(22) Filed: Feb. 5, 2008

(65) Prior Publication Data
US 2008/0153215 A1   Jun. 26, 2008

Related U.S. Application Data

(62) Division of application No. 11/374,819, filed on Mar. 14, 2006.

(51) Int. Cl.
*H01L 21/338* (2006.01)
(52) U.S. Cl. ............... 438/172; 257/E21.403; 438/167; 438/694
(58) Field of Classification Search .................. 438/694, 438/167, 172; 257/E21.403
See application file for complete search history.

(56) References Cited

U.S. PATENT DOCUMENTS

| | | | |
|---|---|---|---|
| 5,670,798 A | 9/1997 | Schetzina | |
| 6,064,082 A | 5/2000 | Kawai et al. | |
| 6,127,272 A | 10/2000 | Weitzel et al. | |
| 6,146,978 A | 11/2000 | Michael et al. | |
| 6,461,944 B2 | 10/2002 | Neudeck et al. | |
| 6,534,801 B2 | 3/2003 | Yoshida | |
| 2002/0079508 A1 | 6/2002 | Yoshida | |
| 2002/0096692 A1 | 7/2002 | Nakamura et al. | |
| 2002/0106842 A1 | 8/2002 | Neudeck et al. | |
| 2002/0167023 A1 | 11/2002 | Chavarkar et al. | |
| 2003/0020092 A1 | 1/2003 | Parikh et al. | |
| 2003/0205774 A1 | 11/2003 | Hokazono | |

(Continued)

FOREIGN PATENT DOCUMENTS

JP    2002280571    9/2002

(Continued)

OTHER PUBLICATIONS

Aktas et al., "Microwave Performance of AlGaN/GaN Inverted MODFET's", IEEE Electron Device Letters, vol. 18, No. 6, Jun. 1997, pp. 293-95.

(Continued)

*Primary Examiner* — Matthew Reames
(74) *Attorney, Agent, or Firm* — John S. Paniaguas; Katten Muchin Rosenman LLP

(57) ABSTRACT

An improved HEMT formed from a GaN material system is disclosed which has reduced gate leakage current relative to known GaN based HEMTs and eliminates the problem of current constrictions resulting from deposition of the gate metal over the step discontinuities formed over the gate mesa. The HEMT device is formed from a GaN material system. One or more GaN based materials are layered and etched to form a gate mesa with step discontinuities defining source and drain regions. In order to reduce the leakage current, the step discontinuities are back-filled with an insulating material, such as silicon nitride (SiN), forming a flat surface relative to the source and drain regions, to enable to the gate metal to lay flat. By back-filling the source and drain regions with an insulating material, leakage currents between the gate and source and the gate and drain are greatly reduced. In addition, current constrictions resulting from the deposition of the gate metal over a step discontinuity are virtually eliminated.

6 Claims, 4 Drawing Sheets

U.S. PATENT DOCUMENTS

| | | |
|---|---|---|
| 2007/0000433 A1 | 1/2007 | Briere et al. |
| 2007/0218611 A1 | 9/2007 | Sandhu |

FOREIGN PATENT DOCUMENTS

| | | |
|---|---|---|
| WO | WO 98/42024 | 9/1998 |
| WO | WO 03/032397 | 4/2003 |

OTHER PUBLICATIONS

Ao, "Copper gate AlGaN/GaN HEMT With Low Gate Leakage Current", IEEE Electron Device Letters, vol. 24, No. 8, Aug. 2003, pp. 500-02.

Guo et al., Schottky contact and the thermal stability of Ni on n-type GaN, Journal Applied Physics, vol. 80, No. 3, Aug. 1, 1996, pp. 1623-27.

Guo et al., Study of Schottky barriers on n-Type GaN grown by low-pressure metalorganic chemical vapor deposition, Applied, Physics Letters, vol. 67, No. 18, Oct. 30, 1995, pp. 2657-59.

Kapur et al., "Technology and Reliability Constrained Future Copper Interconnects—Part I: Resistance Modeling", IEEE Trans. On Electron Devices, vol. 49, No. 4, Apr. 2002, pp. 590-97.

Keller et al., Gallium Nitride Based High Power Heterojunction Field Effect Transistors: Process Development and Present Status at UCSB, IEEE Trans. On Electron Devices, vol. 48, No. 3, Mar. 2001, pp. 552-59.

Liu et al., Thermally stable PtSi Schottky contact on n-GaN, Applied Physics+ Letters, vol. 70, No. 10, Mar. 10, 1997, pp. 1275-77.

Ohno et al., "Application of GaN-Based Heterojunction FETs for Advanced Wireless Communication", IEEE Trans. On Electron Devices, vol. 48, No. 3, Mar. 2001, pp. 517-23.

Sheppard et al., "High-Power Microwave GaN/AlGaN HEMT's on Semi-Insulating Silicon Carbide Substrates", IEEE Electron Device Letters, vol. 20, No. 4, Apr. 1999, pp. 161-63.

Venugopalan et al., Thermally stable rhenium Schottky contacts to n-GaN, Applied Physics Letters, vol. 73, No. 9, Aug. 31, 1998, pp. 1242-44.

Wang et al., High barrier height GaN Schottky diodes: Pt/GaN and Pd/GaN, Applied Physics Letters, vol. 68, No. 9, Feb. 26, 1996, pp. 1267-69.

Yu et al., Ni and Ti Schottky barriers on n-AlGaN grown on SiC substrates, Applied Physics Letters, vol. 73, No. 2, Jul. 13, 1998, pp. 238-40.

LEAKAGE BARRIER FOR GAN BASED HEMT ACTIVE DEVICE

CROSS-REFERENCE TO RELATED APPLICATIONS

This Application is a Divisional of U.S. patent application Ser. No. 11/374,819 filed Mar. 14, 2006.

BACKGROUND OF THE INVENTION

1. Technical Field

The present invention relates to a high electron mobility transistor (HEMT) formed from a gallium nitride (GaN) material system and more particularly to GaN based HEMT transistor with reduced leakage current.

2. Description of the Prior Art

High electron mobility transistors (HEMTs) are well known in the art and are known to be used are used in various low noise and power microwave applications where high device output power, power added efficiency and noise performance are critical. HEMTs are known to be used in Q, V and W band microwave power amplifiers in commercial and military radar systems, communications systems and the like. HEMTs are also known to be effectively integrated into monolithic microwave integrated circuits and monolithic millimeter wave integrated circuits (MMICs) including phased arrays for radiating at high power levels.

HEMTs formed from Gallium Nitride (GaN) material systems are known. Examples of such GaN based HEMTs are disclosed in U.S. Pat. Nos. 6,064,082; 6,534,801; 6,461,944; U.S. Patent Application publications: US 2002/0079508; US 2002/0096692; US 2002/0106842; US 2002/0167023; and US 2003/0020092. Such GaN HEMTs are also disclosed in Japanese patent no. JP2002280571 as well as International application nos.: PCT/US02/23056; and PCT/US98/04218. Such GaN HEMTs are well published in the literature. See for example: "HIGH-POWER MICROWAVE GaN/AlGaN HEMT's ON SEMI-INSULATING SILICON CARBIDE SUBSTRATES", by S. T. Shepard et. al, *IEEE Electron Device Letters*, Vol. 20, No. 4, April 1999, pages 161-163; "Application of GaN-Based Heterojunction FETs for Advanced Wireless Communication", by Yasuo Ohno et. al. *IEEE Transactions on Electron Devices*, Vol. 48, No. 3, March 2001, pages 517-523; "Galium Nitride Based High Power Heterojunction Field Effect Transistors: Process Development and Present Status at UCSB", by Stacia Keller et. al., *IEEE Transactions on Electron Devices*, Vol. 48, No. 3, March 2001, pages 552-559; "Technology and Reliability Constrained Future Copper Interconnects—Part I: Resistance Modeling", by Pawan Kapur et. al., *IEEE Transactions on Electron Devices*, Vol. 49, No. 4, April 2002, pages 590-597; and "Copper Gate AlGaN/GaN HEMT with Low Gate Leakage Current", by Jin-Ping Ao et. al., *IEEE Electron Device Letters*, Vol. 24, No. 8, August 2003, pages 500-502.

Such GaN based HEMT devices are known to have relatively high gate leakage current. Different techniques have been tried to reduce the leakage current of such GaN based HEMTs. For example, as discussed in "Copper Gate AlGaN/GaN HEMT With Low Gate Leakage Current", supra, leakage currents were shown to be reduced based on the type of metal used for the gate contacts. In particular, copper (Cu) gate contacts were demonstrated to provide reduced gate leakage current relative to comparable devices with gates formed from Ni/Au.

Other techniques for reducing the leakage current of a GaN based HEMT are disclosed in U.S. Patent Application Publication No. U.S. 2003/0020092 A1, published on Jan. 30, 2003, and International Publication No. WO 03/032397 A2 (International Application No. PCT/US02/23056). These publications disclose a GaN based HEMT formed with an insulated gate. In particular, the HEMT is formed with a $Al_xGa_{1-x}$ buffer layer on top of a substrate. A high resistivity layer is formed on top of the buffer layer. A barrier layer, formed from AlGaN, is formed on top of the high resistivity layer. Drain and source contacts are formed on top of high resistivity GaN layer. An insulating layer, formed from SiN, is formed on top of the AlGaN barrier layer. The gate contact is formed on top of the insulating layer. Since the gate contact is insulated from the drain and source contacts, the gate leakage current is reduced. While the above technique may work fairly well with GaN/AlGaN HEMT layered devices, this technique is not applicable to HEMT devices formed without an insulated gate from GaN based materials.

FIGS. 1A-1C illustrate the problem associated with such devices. In particular, the process begins, for example, with a piece of GaN based material 20. As shown in FIG. 1B, the GaN based material is etched to form a mesa region 22 which defines step discontinuities 24 and 26 for the source and drain regions, respectively. As shown in FIG. 1B, these step discontinuities 24 and 26 allow undesirable leakage currents to flow between the source and gate and between drain and gate, resulting in relatively poor electrical isolation between the source and gate as well as between the drain and gate regions.

In addition to the problem mentioned above, the deposition of the gate metal 28 is known to form an overhang over the step discontinuity regions 24 and 26, as shown in FIG. 1 C. In such a configuration, the cross sectional area of the gate metal over the step continuity may not be uniform, resulting in relatively thinner areas of gate metal resulting in a current constriction. Thus, there is a need for an HEMT device formed from GaN material with reduced leakage current, which also eliminates current constrictions resulting from deposition of the gate metal over discontinuities in the device.

SUMMARY OF THE INVENTION

The present invention relates to an improved HEMT formed from a GaN material system which has reduced gate leakage current relative to known GaN based HEMTs and eliminates the problem of current constrictions resulting from deposition of the gate metal over the step discontinuities formed over the gate mesa. In accordance with the present invention, the gate leakage current is reduced by mitigating leakage paths between the gate and ohmic metal pads that may occur through isolated regions of the epilayer material (GaN buffer) as well as from the mesa side wall due intimate contact between the gate metal over hang over the mesa side wall. This novel approach mitigates leakage currents without having to increase the spacing between the gate and HEMT channel, as in the case of the MISFET. Therefore, gate leakage currents can be mitigated without compromising the device high frequency performance due to an improvement in charge modulation for higher frequency performance applications. The HEMT device is formed from a GaN material system. One or more GaN based materials are layered and etched to form a gate mesa with step discontinuities defining source and a drain regions. In order to reduce the leakage current, the step discontinuities are back-filled with an insulating material, such as silicon nitride (SiN), forming a flat surface relative to the source and drain regions, to enable to the gate metal to lay flat. By back-filling the source and drain regions with an insulating material, leakage currents between the gate and source and the gate and drain are greatly reduced.

In addition, current constrictions resulting from the deposition of the gate metal over a step discontinuity are virtually eliminated.

DESCRIPTION OF THE DRAWINGS

These and other advantages of the present invention will be readily understood with reference to the following specification and attached drawing wherein.

DETAILED DESCRIPTION

The present invention relates to a HEMT formed from a GaN material system which has relatively less leakage current than known HEMTs formed from GaN material systems and also solves the problem of current constriction of the gate metal. Two embodiments of the invention are disclosed. One embodiment, illustrated in FIGS. 2A-2D, relates to an embodiment of the invention in which the HEMT is formed from bulk GaN material. An alternate embodiment of the invention is illustrated in FIGS. 3A-3F in which the HEMT is formed from GaN/AlGaN.

Figure 1A:
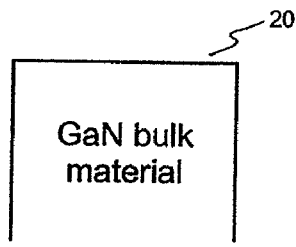
FIGS. 1A-1C illustrate simplified process steps for forming a HEMT from GaN material as known in the art.
Figure 1B:
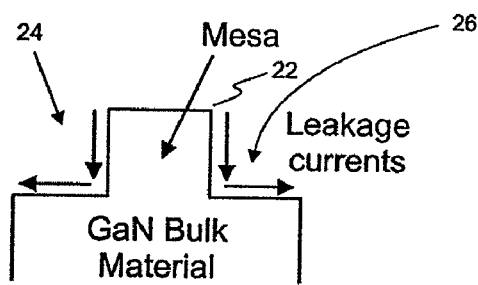
Figure 1C:
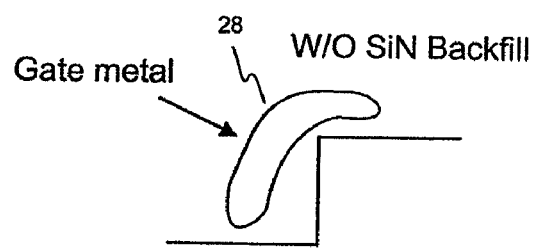
Figure 2A:
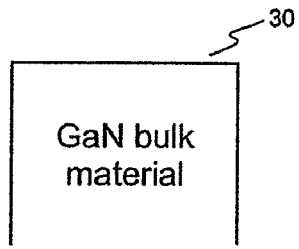
FIGS. 2A-2D illustrate simplified process steps for forming a HEMT from GaN in accordance with the present invention.
Figure 2B:
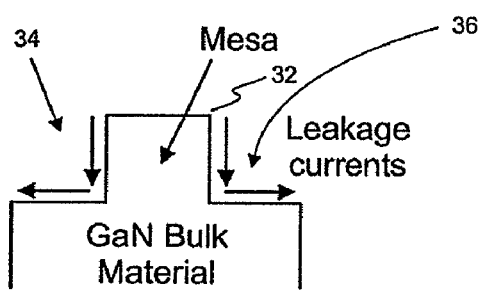
Figure 2C:
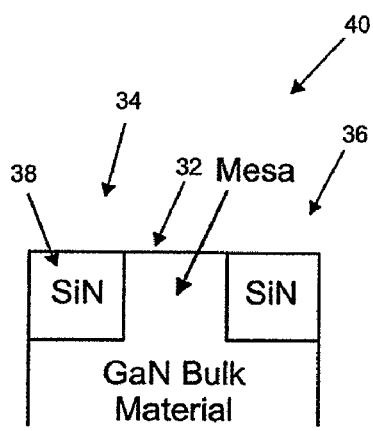
Figure 2D:
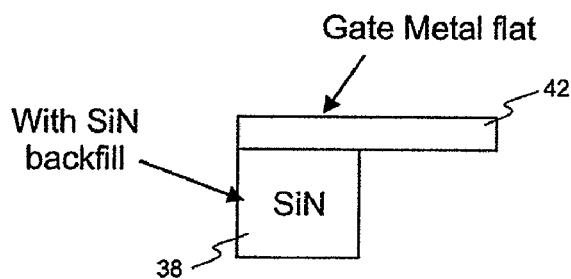

Referring to FIGS. 2A-2D, a simplified explanation of the process in accordance with one embodiment of the present invention is provided. Referring first to FIG. 2A, a bulk GaN material 30 may be used as the starting point for the HEMT. The bulk GaN material is masked by convention photolithography techniques and etched, for example, by buffered oxide wet or Cl-based dry etching, to form a mesa 32. The gate mesa 32 defines a pair of step discontinuities 34 and 36, which correspond to the source and drain regions, respectively. As mentioned above, leakage currents normally flow between the gate 32 and the source 34 as well as between the gate 32 and the drain 36, resulting in relatively poor electrical isolation between the gate, source and drain regions of the device. In accordance with an important aspect of the present invention, an insulating material 38, for example, silicon nitride (SiN) is deposited in the source and drain regions 34 and 36, such that it is relatively flush with the top surface of the mesa 32 to form a relatively flat surface with no step discontinuities. By filling in the source and drain regions 34 and 36 with an insulating material, the leakage current, between the gate 30 and the source 34 and between the gate 30 and the drain 36 regions, is greatly reduced.

In accordance with another important aspect of the invention, the insulating material 38 enables the gate metal 42 to be applied flat, thus eliminating the overhang over the step discontinuity. By forming the gate metal 42 on a flat surface, current constrictions resulting from overhang of portions of the gate metal 42 are virtually reduced, thus further improving the performance of the device.

Figure 3C:
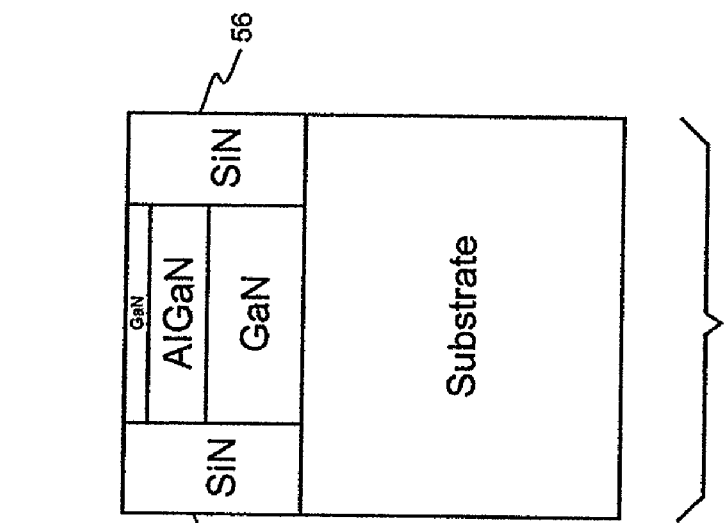
FIGS. 3A-3C are cross sectional views of a semiconductor in various stages of the inventive process that illustrate more detailed process steps for forming the HEMT in accordance with the present invention.
Figure 3B:
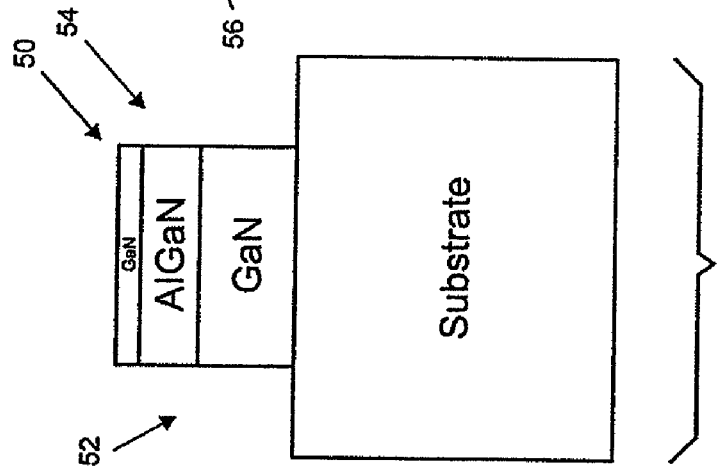
Figure 3A:
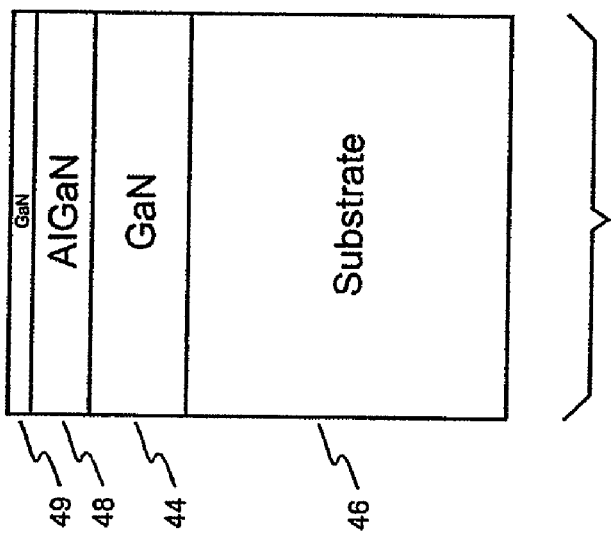

FIGS. 3A-3D illustrate an alternate embodiment of a HEMT formed from a GaN/AlGaN material system in accordance with the present invention. FIG. 3A illustrates the initial growth profile. Initially a GaN layer 44, for example, 0.5 to 2 um, is grown on top of the substrate 46, for example, by molecular beam epitaxi. The substrate 46 may be, for example, sapphire $Al_2O_3$, or silicon carbide SiC. The thickness of the substrate 46 may be, for example, 350 um. A buffer layer 48 may be formed from AlGaN on top of the GaN layer 44. The buffer layer 48 may be formed to a thickness of, for example, 200 to 250 Å. Finally, a top layer 49 of GaN may be formed on top of the buffer layer 49. The top layer of GaN 48 may be formed to a thickness of, for example, 5 to 50 Å.

The device illustrated in FIG. 3A may be masked by conventional photolithograph techniques and etched, for example, by $BCl_3$+Ar dry etching, to form a mesa 50. As shown in FIG. 3B, the mesa 50 defines two step discontinuities 52 and 54, which, in turn, define the source and drain regions 52 and 54. In accordance with an important aspect of the invention as shown in FIG. 3C, the source and drain regions 52 and 54 are filled with an insulating material 56, such as silicon nitride (SiN).

Figure 3F:
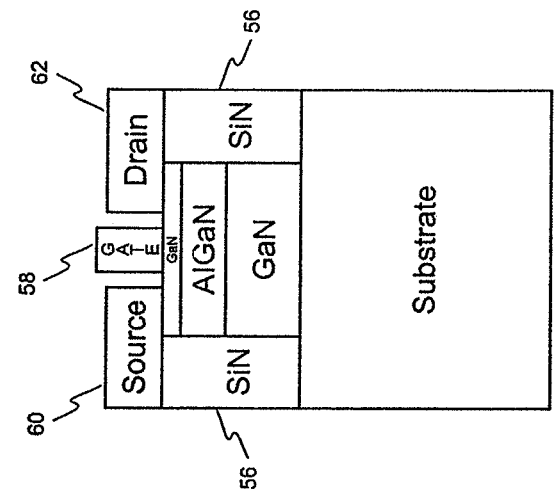
FIG. 3F is a sectional view along line 3F-3F of FIG. 3D, illustrating formation of the source and drain contacts.
Figure 3E:
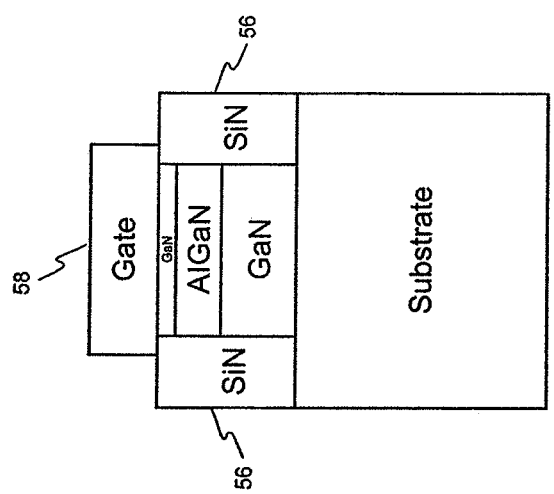
FIG. 3E is a sectional view along line 3E-3E of FIG. 3D, illustrating the formation of the gate contact.
Figure 3D:
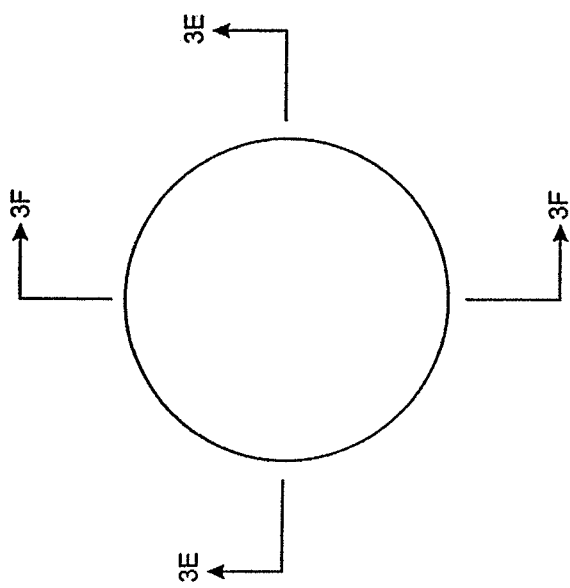
FIG. 3D is a plan view of the semiconductor illustrated in FIG. 3C.

As shown in FIG. 3D, the gate metal 58, is deposited on top of the mesa 50 as well as on top of the silicon nitride 56. In addition, as shown in FIG. 3F, the source 60 and drain 62 contacts are deposited adjacent the gate metal 58 by conventional techniques.

Obviously, many modifications and variations of the present invention are possible in light of the above teachings. Thus, it is to be understood that, within the scope of the appended claims, the invention may be practiced otherwise than as specifically described above.

What is described to be secured by Letters Patent is covered by the appended claims.

We claim:

1. A process for forming a high electron mobility transistor (HEMT) comprising:
   (a) providing a substrate;
   (b) depositing one or more Gallium Nitride (GaN) based materials on said substrate;
   (c) forming a mesa on said substrate with said GaN based materials which defines a gate region on top of said mesa and drain and source regions on opposing sides next to said mesa on said substrate, said mesa defining vertical sidewalls between said gate region and said drain and source regions and forming steps on opposing sides of said mesa;
   (d) depositing insulation on said substrate in said drain and source regions so that it is flush with the top of the mesa and flush with said vertical sidewalls, thereby eliminating said steps between said gate region and said drain and source regions; and
   (e) forming gate metal on a portion of said gate region defining a gate contact and exposed portions on opposing sides of said gate contact; and
   (f) forming source and drain contacts on said insulation in said drain and source regions and in contact with said exposed portions of said gate region.

2. The process as recited in claim 1, wherein said GaN based material includes bulk GaN.

3. The process as recited in claim 1, wherein said GaN based material includes GaN and aluminum gallium nitride (AlGaN).

4. The process as recited in claim 3, wherein the step of depositing one or more GaN based materials comprises:
   depositing a GaN layer on top of said substrate;

depositing a buffer layer of AlGaN on top of said GaN layer; and depositing a top GaN layer on top of said buffer layer.

5. The process as recited in claim 1, wherein said insulating material is silicon nitride (SiN).

6. The process as recited in claim 1, wherein step (e) comprises:

(e1) depositing gate metal on said mesa in said gate region and on said insulation disposed in said drain and source regions;

(e2) removing said gate metal from portions of said gate region adjacent said drain and source regions defining exposed gate portions and from said drain and source regions.

* * * * *